United States Patent [19]
Yatsuda et al.

[11] Patent Number: 4,878,036
[45] Date of Patent: Oct. 31, 1989

[54] SURFACE ELASTIC WAVE FILTER

[75] Inventors: Hiromi Yatsuda; Yoshihiko Takeuchi; Toichi Kohda; Shokichiro Yoshikawa, all of Mitaka, Japan

[73] Assignee: Nihon Musen Kabushiki Kaisha, Tokyo, Japan

[21] Appl. No.: 73,976

[22] Filed: Jul. 15, 1987

[30] Foreign Application Priority Data

Jul. 16, 1986 [JP] Japan ................................ 61-167460
Jul. 30, 1986 [JP] Japan ................................ 61-180798

[51] Int. Cl.⁴ .............................................. H03H 3/64
[52] U.S. Cl. .................................... 333/195; 333/193;
333/153; 310/313 B; 310/313 D
[58] Field of Search .......................... 333/150-155,
333/193, 194, 195, 196; 310/313 R, 313 A, 313
B, 313 C, 313 D

[56] References Cited

U.S. PATENT DOCUMENTS

| | | | |
|---|---|---|---|
| 3,946,342 | 3/1976 | Hartmann | 333/196 |
| 3,999,153 | 12/1976 | Borner | 333/193 |
| 4,055,820 | 10/1977 | Solie | 310/313 D |
| 4,130,813 | 12/1978 | Sandy et al. | 333/195 X |
| 4,134,087 | 1/1979 | Gerard et al. | 310/313 C |
| 4,155,056 | 5/1979 | Cross | 333/195 |
| 4,336,514 | 6/1982 | Paige | 333/196 |
| 4,635,008 | 1/1987 | Solie | 333/195 |

FOREIGN PATENT DOCUMENTS

| | | | |
|---|---|---|---|
| 0202511 | 9/1986 | Japan | 333/193 |
| 1512790 | 6/1978 | United Kingdom . | |
| 1604573 | 12/1981 | United Kingdom . | |
| 2108800A | 5/1983 | United Kingdom . | |

Primary Examiner—Eugene R. LaRoche
Assistant Examiner—Seung Ham
Attorney, Agent, or Firm—Burns, Doane, Swecker & Mathis

[57] ABSTRACT

A surface elastic wave filter has a pair of electrodes on a surface of a piezoelectric body, and at least one of the electrodes is constructed as electrode fingers in the form of comb teeth which are progressively spread away from each other along a direction normal to the direction in which a surface elastic wave is propagated on the surface of the piezoelectric body. A grating or dot structure as a scattering reflector for scattering and reflecting a portion of the surface elastic wave is disposed in a desired position between the electrodes. Alternatively, some of electrode fingers of a surface elastic wave filter are dropped or removed, or divided voltages are applied to electrode fingers, or a scattering reflector is added to a filter with some of its electrode fingers removed or with divided voltages applied to electrode fingers. With such an arrangement, a filter having good selectivity and desired frequency characteristics can be achieved.

10 Claims, 12 Drawing Sheets

SURFACE ELASTIC WAVE FILTER

BACKGROUND OF THE INVENTION

The present invention relates to a surface elastic wave filter, and more particularly to a filter employing a surface elastic wave device comprising electrodes in the form of a pair of thin metallic films on a surface of a piezoelectric body for sending and receiving a surface elastic wave between the electrodes to pick up a signal having desired frequency characteristics.

Surface elastic wave devices utilize the properties of a surface elastic wave such that most of its energy is propagated along a surface of a solid body. Such surface elastic wave devices are used in oscillators, filter circuits, delay circuits, and the like in various pieces of communication or electronic equipment. The surface elastic wave device comprises, for example, a piezoelectric crystal body with a ground surface and electrodes in the form of a pair of thin metallic films on the surface of the piezoelectric crystal body for sending and receiving a surface elastic wave between the electrodes. More specifically, when one of the electrodes or the piezoelectric crystal body receives an electric input signal, the piezoelectric body vibrates due to the piezoelectric effect, and the vibration is transmitted from the electrode and propagated as an elastic wave along the surface of the piezoelectric body toward the other electrode. The other electrode receives the elastic wave and issues an electric output signal due to the reverse piezoelectric effect of the piezoelectric body.

FIG. 1 of the accompanying drawings illustrates a conventional filter, generally designated by the reference numeral 2, comprising such a surface elastic wave device. The filter 2 has a piezoelectric body 4 serving as a signal propagation medium and a pair of input and output electrodes 6, 8 disposed as signal transducer means on a surface of the piezoelectric body 4. The input electrode 6 comprises a pair of common electrodes 12a, 12b having plural parallel electrode fingers 10a, 10b, respectively, in the shape of comb teeth. The electrode fingers 10a, 10b are disposed in interdigitating relation. An input signal IN is applied between the common electrodes 12a, 12b. The output electrode 8 comprises a pair of common electrodes 16a, 16b having plural interdigitating parallel electrode fingers 14a, 14b, respectively. An output signal OUT is produced from between the common electrodes 16a, 16b. The electrode fingers 10a, 10b and 14a, 14b extend perpendicularly to the direction indicated by the arrow T along which a surface elastic wave is propagated on the surface of the piezoelectric body 4.

When an input signal IN is applied between the common electrodes 12a, 12b of the input electrode 12, a surface elastic wave is generated between the electrode fingers 10a, 10b due to the piezoelectric effect. The produced surface elastic wave is propagated in the direction T and reaches the output electrode 8, which converts the surface elastic wave to an electric signal due to the reverse piezoelectric effect. The electric signal is issued as an output signal OUT from between the common electrodes 16a, 16b of the output electrode 16.

It is known that the output signal OUT from the filter 2 has frequency characteristics dependent on the structure of the input and output electrodes 6, 8. Therefore, an output signal OUT of desired frequency characteristics might be obtained from the filter 2 by adjusting or varying the spacings between the electrode fingers 10a, 10b, 14a, 14b or the number or the configuration of these electrode fingers. It would, however, be quite difficult to achieve complex frequency characteristics having a plurality of passbands or notch filter characteristics having a frequency rejection band within a passband in the above filter, i.e., a filter including in combination an apodized electrode and a normal electrode.

Another conventional surface elastic wave filter is shown in FIG. 2 of the accompanying drawings The filter, generally denoted at 18, comprises an input electrode 20 and an output electrode 22 on a surface of a piezoelectric body 4. The input electrode 20 has two common electrodes 24a, 24b. The common electrode 24a has a plurality of electrode fingers 26a in the shape of comb teeth which are progressively closer to each other toward the other common electrode 24b. The common electrode 24b has a plurality of electrode fingers 26b in the shape of comb teeth which are progressively spread away each other toward the common electrode 24a. These electrode fingers 26a, 26b are disposed in interdigitating fashion. The output electrode 22 includes a pair of common electrodes 28a, 28b having electrode fingers 30a, 30b, respectively, which are shaped and positioned in the same manner as the electrode fingers 26a, 26b of the input electrode 20.

It is known in the art that the frequency characteristics of an output signal OUT produced by the filter 18 have a substantially rectangular pattern, as shown in FIG. 3. Denoted at a in FIG. 3 is the width of a passband in which the output signal 18 is produced by the filter 18, the passband width a being determined by the maximum and minimum spacings between the electrode fingers 26a, 26b or 30a, 30b.

Since the frequency characteristics of the output signal OUT produced by the filter 18 is of a simple rectangular pattern, the electrodes need to be designed further in order to obtain an output signal OUT which has desired complicated frequency characteristics. Obtaining an output signal OUT which has desired complicated frequency characteristics might be accomplished by combining the filter 2 or the filter 8 with a filter in the form of an electric circuit comprising resistors, capacitors, and the like. However, use of such an external electric circuit would make the entire assembly more complex.

The filter is required to increase its ability to separate a desired signal from an unwanted signal, known as "selectivity", by increasing the ratio S (see FIG. 3) between the insertion loss at passed frequencies and the loss at cut-off frequencies. With a generally employed combination of an apodized electrode and a normal electrode, however, it would be difficult to improve selectivity with respect to wideband filters having a fractional band of 30% or more. It would be possible to increase the fractional band, but no method has been proposed to better the selectivity, for the filter as illustrated in FIG. 2.

No proposal has been made to increase the selectivity with respect to the control of frequency characteristics on the propagation path between the input and output electrodes. Therefore, in applications such for example as a notch filter having a frequency rejection band within a passband, it has been difficult to design the filter such that the rejection band will be reduced while increasing the amount of attenuation of rejected frequencies. More specifically, the intensity distribution of a surface elastic wave excited when a certain frequency is applied, in a direction normal to the direction of propagation, is expressed as a function of sin(x)/x with its frequency f at the center, where $$x = N\pi(f-fi)/fi$$

(N is the number of electrode finger pairs) Therefore, even if the surface elastic wave is attenuated in a channel in the propagation path which corresponds to a certain frequency, the surface elastic wave is excited from another channel as a side lobe. Consequently, where the number of input electrode finger pairs is equal to the number of output electrode finger pairs, the amount of frequency attenuation attained in a certain channel is only 26 dB even from the standpoint of theoretical considerations.

SUMMARY OF THE INVENTION

It is a general object of the present invention to provide a surface elastic wave filter capable of producing a signal of desired frequency characteristics by positioning a grating structure or a dot structure for scattering and reflecting a portion of a surface elastic wave at a location between a pair of electrodes on a surface of a piezoelectric body, or reducing the number of electrode fingers of the surface elastic wave filter, or effecting weighting such as voltage division.

Another object of the present invention is to provide a surface elastic wave filter comprising a piezoelectric body having a surface, a pair of electrodes disposed on the surface for sending and receiving a surface elastic wave between the electrodes to pick up a signal of prescribed frequency characteristics, at least one of the electrodes comprising a plurality of electrode fingers progressively spread from each other, and a structure disposed on the surface between the electrodes for scattering and reflecting a surface elastic wave of a prescribe frequency.

Still another object of the present invention is to provide a surface elastic wave filter wherein the structure comprises a grating structure.

Yet still another object of the present invention is to provide a surface elastic wave filter wherein the structure comprises a dot structure.

Yet another object of the present invention is to provide a surface elastic wave filter wherein the dot structure comprises a plurality of dots spaced at a constant spacing and arranged at a pitch equal to a multiple of ½ of the wavelength of the surface elastic wave.

A further object of the present invention is to provide a surface elastic wave filter wherein the structure is inclined from a direction normal to the direction in which the surface elastic wave is propagated between the electrodes.

A still further object of the present invention is to provide a surface elastic wave filter comprising a piezoelectric body having a surface, a pair of electrodes disposed on the surface for sending and receiving a surface elastic wave between the electrodes to pick up a signal of prescribed frequency characteristics, at least one of the electrodes comprising a plurality of electrode fingers progressively spread from each other, and one or both of the electrodes comprising a group of electrode fingers and being devoid of electrode fingers which would make a complete set of electrode fingers if combined with the group of electrode fingers.

A yet still further object of the present invention is to provide a surface elastic wave filter comprising a piezoelectric body having a surface, a pair of electrodes disposed on the surface for sending and receiving a surface elastic wave between the electrodes to pick up a signal of prescribed frequency characteristics, at least one of the electrodes comprising a plurality of electrode fingers progressively spread from each other, and a plurality of resistors connected in series respectively with electrode fingers of one or both of the electrodes.

Another object of the present invention is to provide a surface elastic wave filter comprising a piezoelectric body having a surface, a pair of electrodes disposed on the surface for sending and receiving a surface elastic wave between the electrodes to pick up a signal of prescribed frequency characteristics, at least one of the electrodes comprising a plurality of electrode fingers progressively spread from each other, one or both of the electrodes comprising a group of electrode fingers and being devoid of electrode fingers which would make a complete set of electrode fingers if combined with the group of electrode fingers, and a scattering reflector comprising a grating structure and/or a dot structure and disposed on the surface on which the surface elastic wave is propagated.

Still another object of the present invention is to provide a surface elastic wave filter comprising a piezoelectric body having a surface, a pair of electrodes disposed on the surface for sending and receiving a surface elastic wave between the electrodes to pick up a signal of prescribed frequency characteristics, at least one of the electrodes comprising a plurality of electrode fingers progressively spread from each other, a plurality of resistors connected in series respectively with electrode fingers of one or both of the electrodes, and a scattering reflector comprising a grating structure and/or a dot structure and disposed on the surface on which the surface elastic wave is propagated.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 4:
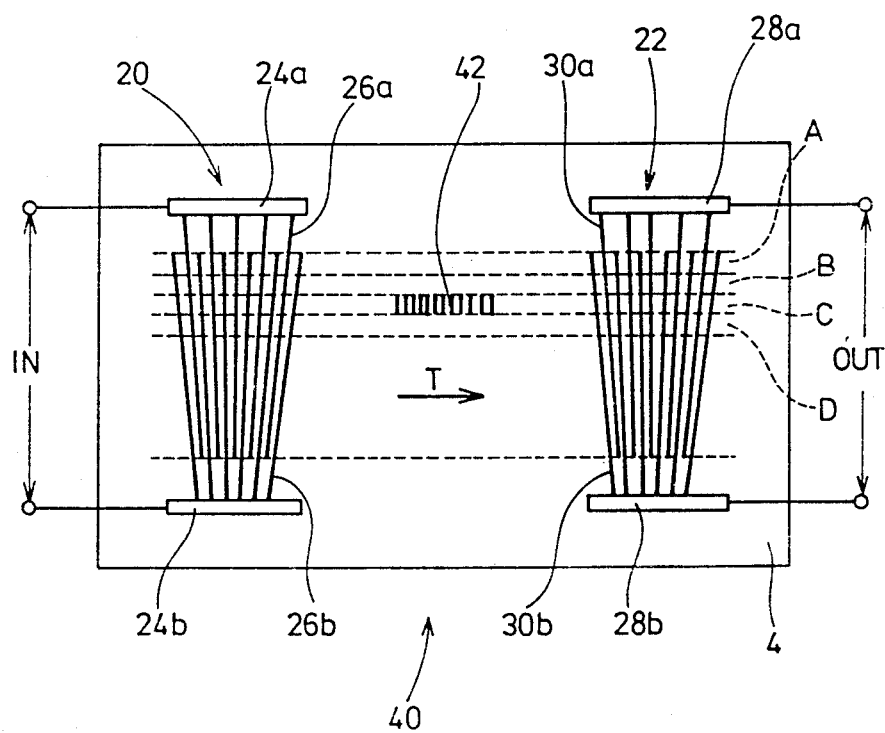
FIG. 4 is a plan view of a surface elastic wave filter according to the present invention.

FIG. 4 shows a filter, generally designated by the reference numeral 10, employing a surface elastic wave device according to the present invention. The filter 40 comprises a piezoelectric body 4 as a substrate which is made of a crystal of lithium niobate ($LiNbO_3$). The piezoelectric body 4 has a ground surface on which input and output electrodes 20, 22 in the form of a pair of thin metallic films are formed by evaporation or the like. The input electrode 20 comprises a common electrode 24a having a plurality of electrode fingers 26a in the shape of comb teeth, and a common electrode 24b having a plurality of electrode fingers 26b in the shape of comb teeth, the electrode fingers 26a, 26b being arranged interdigitating relation. The electrode fingers 26a are progressively closer to each other in a direction away from the common electrode 24a toward the common electrode 24b, the electrode fingers 26b are progressively spread away each other in a direction away from the common electrode 24b toward the common electrode 24a. The output electrode 22 comprises a common electrode 28a having a plurality of electrode fingers 30a in the shape of comb teeth, and a common electrode 28b having a plurality of electrode fingers 30b in the shape of comb teeth. The output electrode 22 is disposed on the surface of the piezoelectric body 4 in the same pattern as that of the input electrode 20. The electrode fingers 26a, 26b, 30a, 30b extend in a direction substantially normal to the direction indicated by the allow T along which a surface elastic wave is propagated from the input electrode 20 to the output electrode 22.

A grating structure in the form of a scattering reflector 42 is disposed between the input electrode 20 and the output electrode 22. The scattering reflector 42 comprises a plurality of grating lines oriented in a direction normal to the direction T of propagation of the surface elastic wave, and spaced apart from each other in the direction T of propagation. The scattering reflector 42 is made of the same thin metallic film as those of the input and output electrodes 20, 22, and should preferably be formed by evaporation or the like at the same time that the electrodes 20, 22 are formed.

Operation and advantages of the surface elastic wave filter thus constructed will hereinafter be described.

Figure 3:
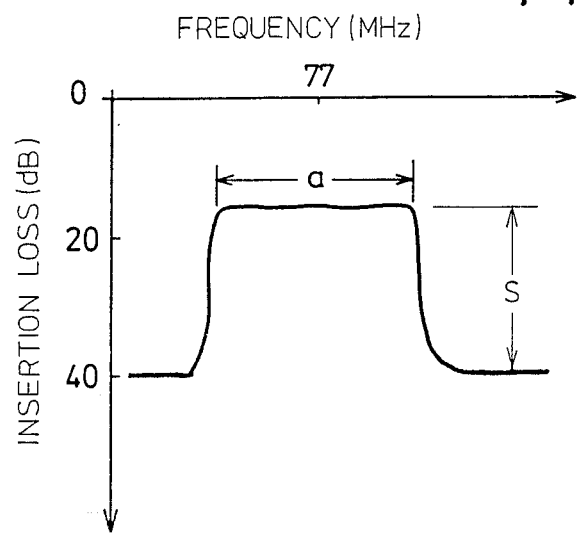
FIG. 3 is a diagram showing frequency characteristics of the filter shown in FIG. 2.

When an input signal IN is applied between the common electrodes 24a, 24b of the input electrode 20, the piezoelectric body 4 vibrates due to the piezoelectric effect. The vibration is propagated from the input electrode 20 as an elastic wave along the surface of the piezoelectric body 4 toward the output electrode 22. The frequency band of the elastic wave propagated to the output electrode 22 is governed by the maximum and minimum spacings between the electrode fingers 26a and between the electrode fingers 26b, or between electrode fingers 30a and between the electrode fingers 30b, as described above where the elastic wave transmission region between the input electrode 20 and the output electrode 22 is divided into a plurality of channels along the direction T of propagation as shown in FIG. 4, elastic waves of normal distribution with different central frequencies are propagated respectively through these channels A, B, C, D, . . . The elastic waves thus propagated with the channels A, B, C, C, . . . are converted by the output electrode 22 to an output electric signal OUT. If it were not for the scattering reflector 42, all of the elastic waves passing through the respective channels A, B, C, D, . . . would be combined, and the output signal OUT has the frequency characteristics as shown in FIG. 3.

Figure 5:
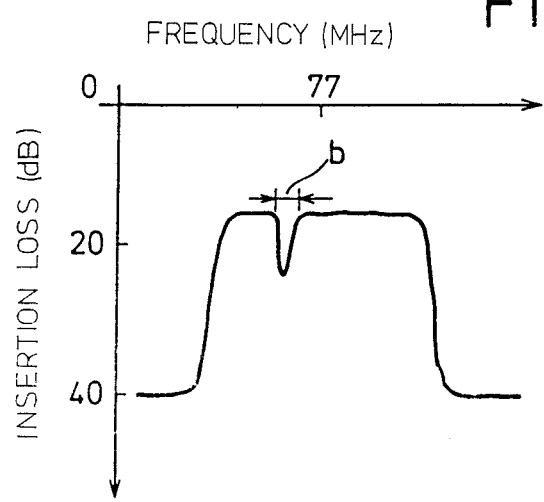
FIG. 5 is a diagram showing frequency characteristics of the filter shown in FIG. 4.

According to the present invention, the scattering reflector 42 is disposed in the channel C between the input electrode 20 and the output electrode 22. Therefore, the elastic wave going through the channel C is scattered and reflected by the scattering reflector 42, and fails to reach the output electrode 22. Therefore, an output signal OUT produced by the output electrode 22 has frequency characteristics from which the elastic wave having a central frequency corresponding to the channel C is dropped. FIG. 5 shows such frequency characteristics, with b indicating a frequency rejection band in which the elastic wave in the channel C is scattered and reflected.

The frequency characteristics with such a frequency rejection band b are called notch filter characteristics, and the filter exhibiting such frequency characteristics can effectively be used, for example, as a notch filter for removing a disturbing signal from the video signal band of a television wave. Since the scattering reflector 42 can be fabricated by evaporation or the like at the same time that the input and output electrodes 20, 22 are fabricated, the filter 40 can be manufactured at substantially the same cost or in substantially the same period of time as the conventional filter 18 shown in FIG. 2.

Figure 1:
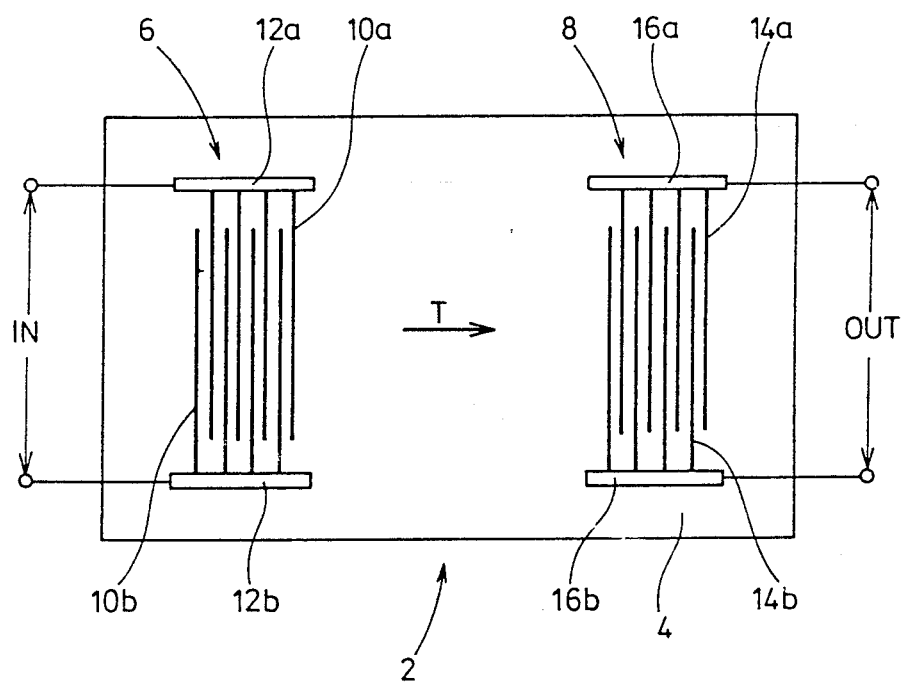
FIGS. 1 and 2 are plan views of conventional filters.
Figure 2:
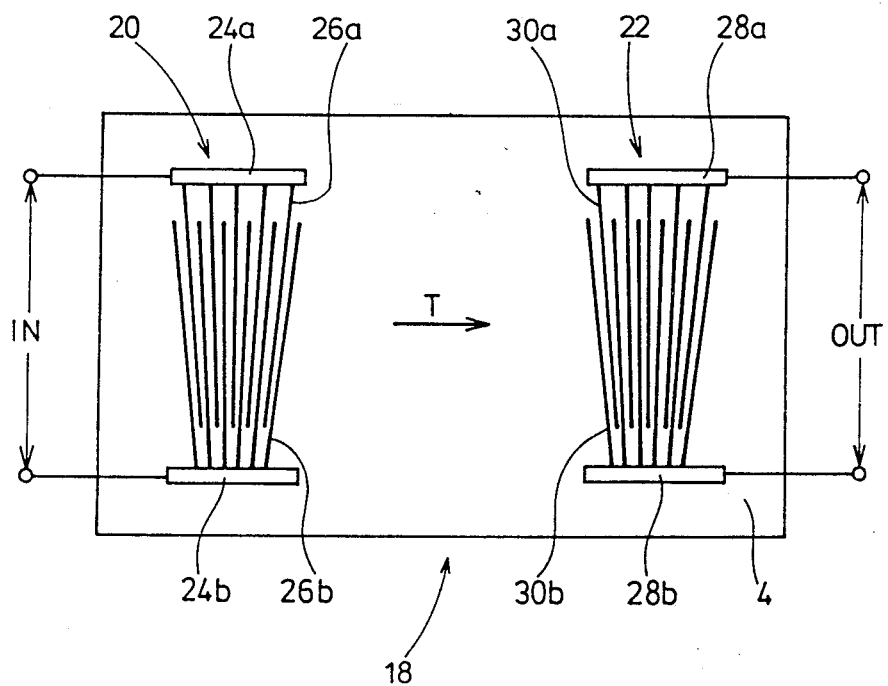

The frequency characteristics determined by the electrodes 20, 22 are not required to modify, but desired frequencies can be rejected only by changing the propagation path in the above manner. Therefore, the frequency characteristics of an elastic surface wave device can be altered or modified after it has been manufactured, such alteration or modification being impossible to make heretofore. More specifically, a filter as shown in FIG. 2 which has frequency characteristics as shown in FIG. 3 is designed and a patterning mask for such a filter is manufactured. Then, a notch filter having desired frequency characteristics can be produced by manufacturing a patterning mask for a propagation path or forming a scattering reflector directly on the propagation path on the filter of FIG. 2.

The scattering reflector 42 may be formed as a thin metallic film of aluminum, gold, or the like by evaporation, etc. Furthermore, the scattering reflector 42 may also be formed of an oxide such as silicon dioxide. Alternatively, desired frequencies can be cut off by defining, instead of the scattering reflector 42, grooves as a grating structure in a prescribed area in the elastic wave propagation path through ion etching, ion implantation, or the like.

Figure 6:
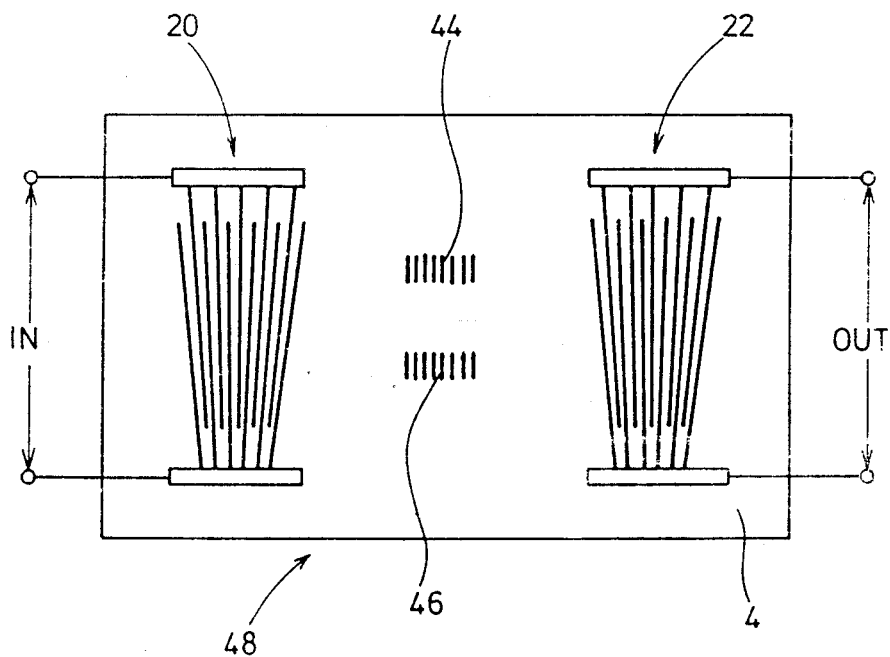
FIG. 6 is a plan view of a surface elastic wave filter according to another embodiment of the present invention.

FIG. 6 shows a surface elastic wave filter 48 according to another embodiment of the present invention. The filter 48 includes grating structures in the form of scattering reflectors 44, 46 disposed respectively in different channels in the elastic wave propagation path between the input and output electrodes 20, 22.

Figure 7:
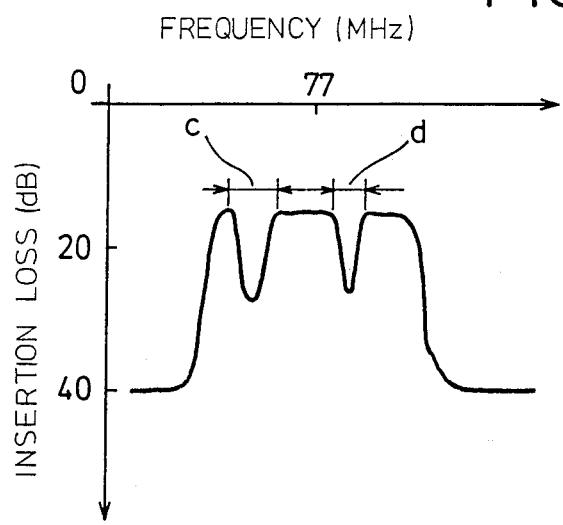
FIG. 7 is a diagram showing frequency characteristics of the filter shown in FIG. 6.

Elastic waves of two different frequencies passing through these channels are scattered and reflected by the scattering reflectors 44, 46. The output signal OUT from the output electrode 22 has frequency characteristics with two frequency rejection bands c, d as shown in FIG. 7.

Figure 8:
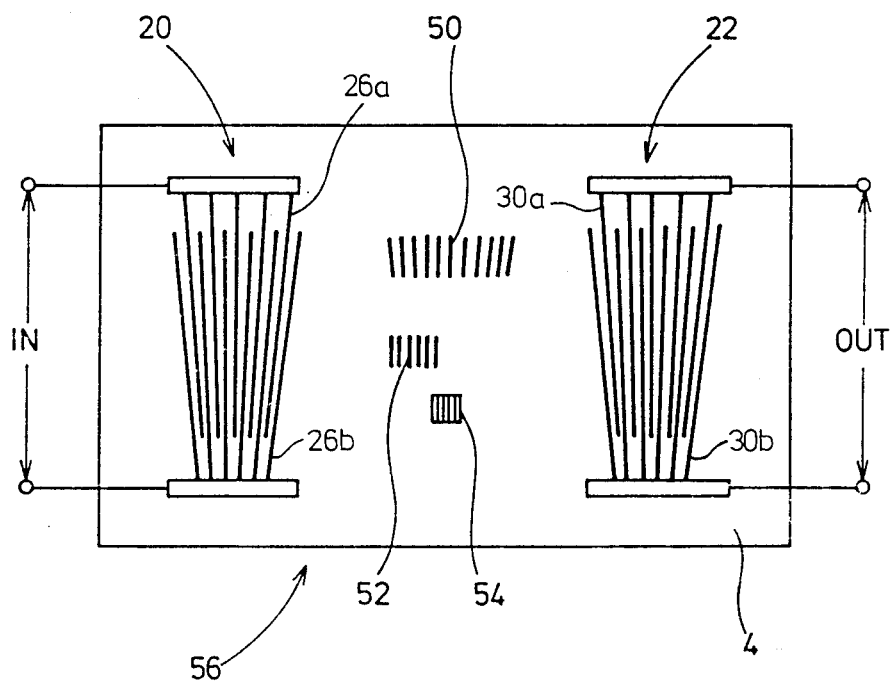
FIG. 8 is a plan view of a surface elastic wave filter according to still another embodiment of the present invention.

According to still another embodiment shown in FIG. 8, a filter 56 has grating structures of different shapes in the form of scattering reflectors 50, 52, 54 disposed respectively in different channels in the elastic wave propagation path between the input and output electrodes 20, 22.

The scattering reflector 50 comprises a plurality of metallic wires inclined with respect to a direction normal to the direction T of propagation of the elastic wave and spaced from each other in the direction T. The scattering reflector 52 comprises a plurality of metallic wires extending normal to the direction T of propagation and spaced from each other in the direction T. The scattering reflector 54 is similar to the scattering reflector 52 except that the ends of the metallic wires are interconnected.

Any of the scattering reflectors 50, 52, 54 can scatter and reflect elastic waves of desired frequencies in the respective channels A, B, C, D, . . . as shown in FIG. 4. Therefore, an output signal OUT of desired frequency characteristics can be produced from the output electrode 22 by positioning the scattering reflectors 50, 52, 54 in desired channels in the propagation path and by adjusting the maximum and minimum spacings between the electrode fingers 26a and between the electrode fingers 26b or between the electrode fingers 30a and between the electrode fingers 30b.

Figure 9:
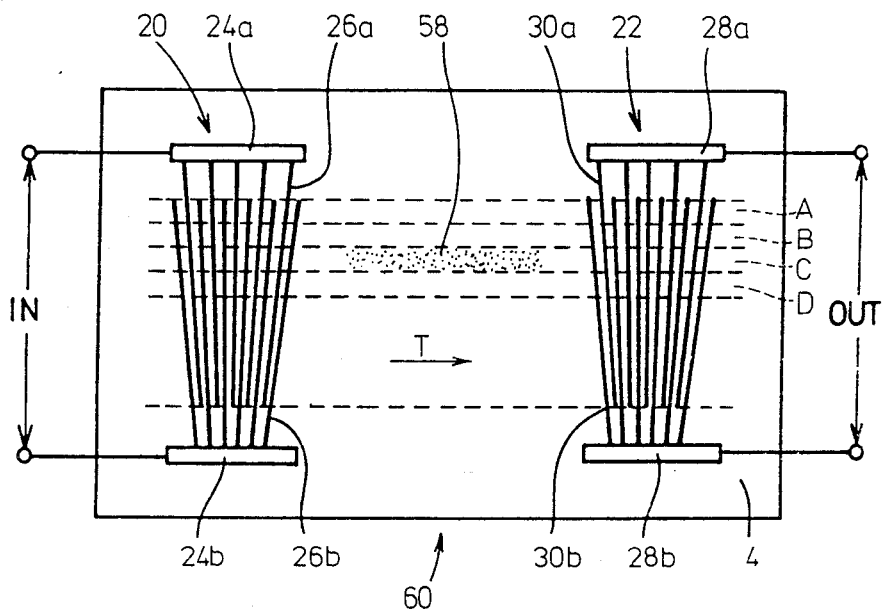
FIGS. 9 and 10 are plan views of surface elastic wave filters according to other embodiments of the present invention.
Figure 10:
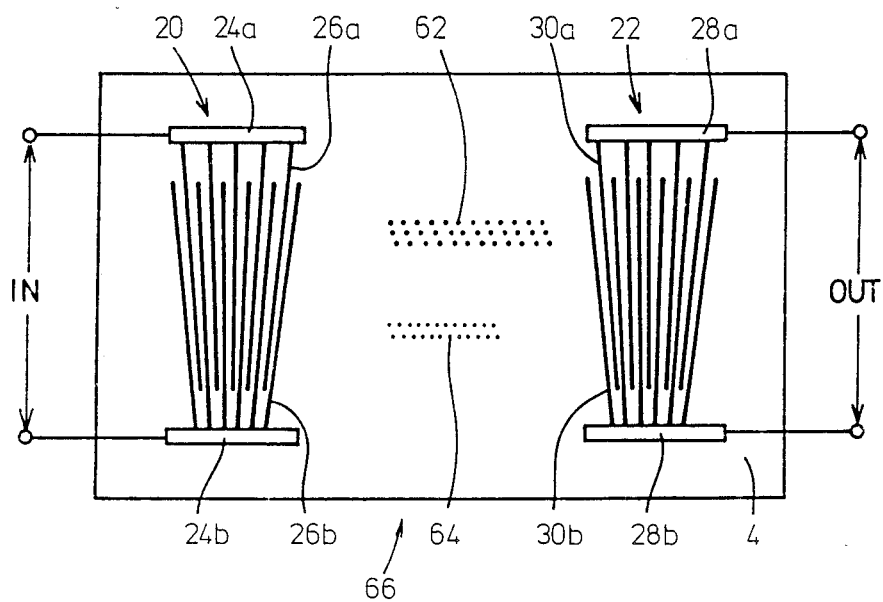

FIGS. 9 and 10 illustrate surface elastic wave filters 60, 66, respectively, according to other embodiments of the present invention. The filter 60 has a scattering reflector 58 disposed as a dot structure in a channel in the propagation path of the elastic wave. The filter 66 has scattering reflectors 62, 64 disposed as dot structures in respective channels in the propagation path of the elastic wave.

These filters 60, 66 operate in the same manner as the respective filters 40, 48 (FIGS. 4 and 6) of the previous embodiments, so that the filters 60, 66 can produce output signals having the frequency characteristics as illustrated in FIGS. 5 and 7.

Figure 11:
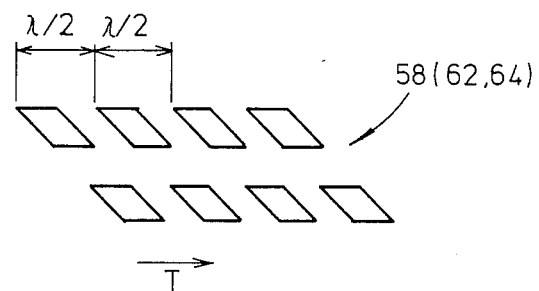
FIG. 11 is a plan view of a scattering reflector employed in the filters shown in FIGS. 9 and 10.

The dot structure of each of the scattering reflectors 58, 62, 64 is composed of dots which may be of any of various shapes such as a rectangle other than a circle. FIG. 11 shows, by way of example, of the shape of dots of the dot structure. The elastic wave can be reflected and scattered with best efficiency by keeping the dots spaced at a constant interval or spacing along the direction T of propagation of the elastic wave and also by equalizing the dot-to-dot pitch to a multiple of ½ of the wavelength of the surface elastic wave. As shown in FIG. 11, each of the dots may be lozenged and inclined from the direction normal to the direction T of propagation for preventing the surface elastic wave scattered and reflected by the scattering reflectors 58, 62, 64 from being received by the input electrode 20. With this dot arrangement and shape, the frequency characteristic curve in the frequency passband a can be as flat as possible.

Figure 12:
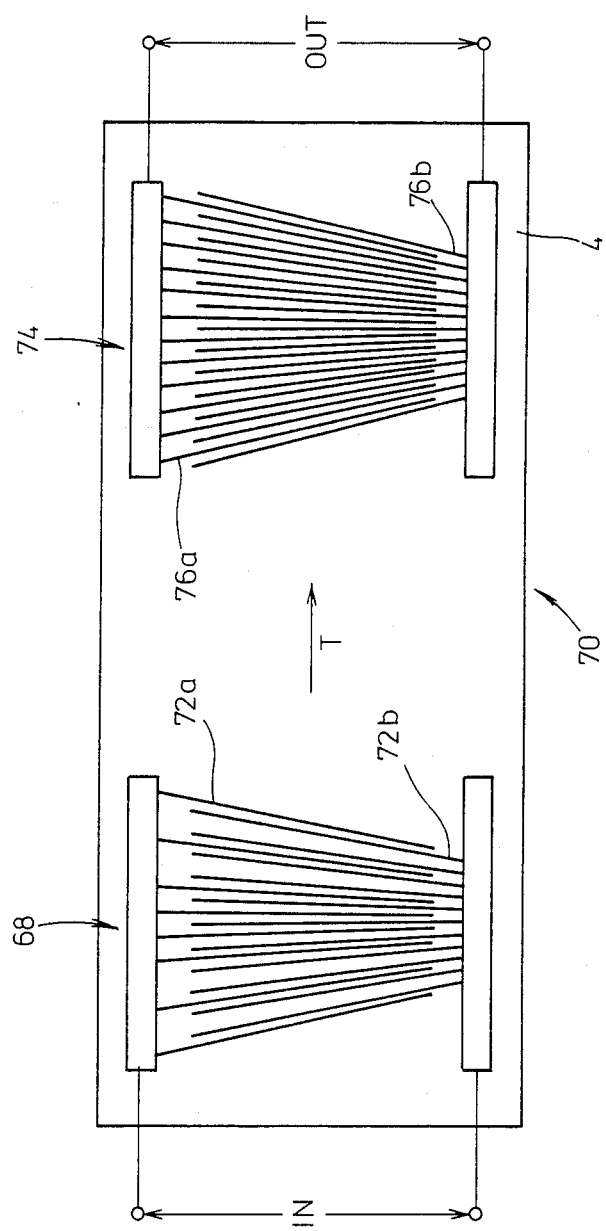
FIG. 12 is a plan view of a surface elastic wave filter according to a further embodiment of the present invention.
Figure 13:
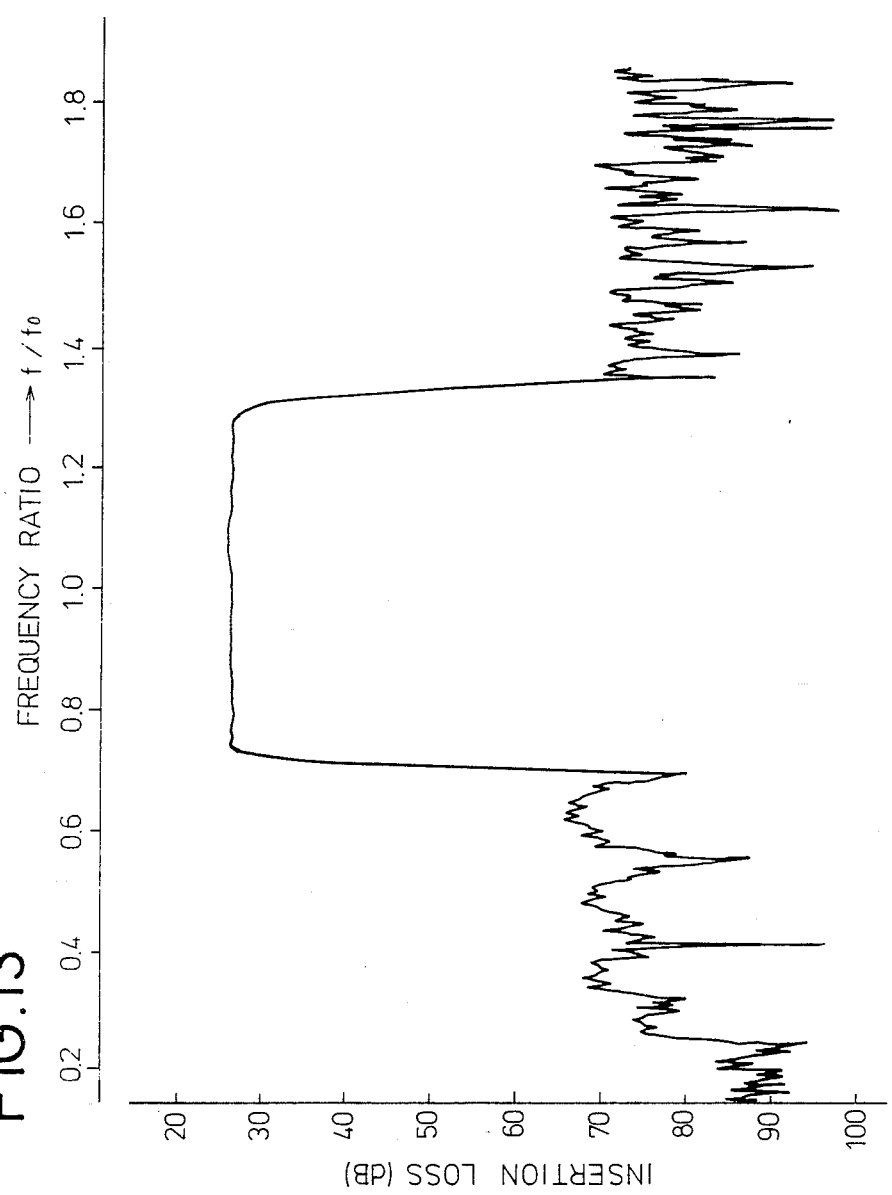
FIG. 13 is a diagram illustrating normalized frequency characteristics of the filter shown in FIG. 12.
Figure 14:
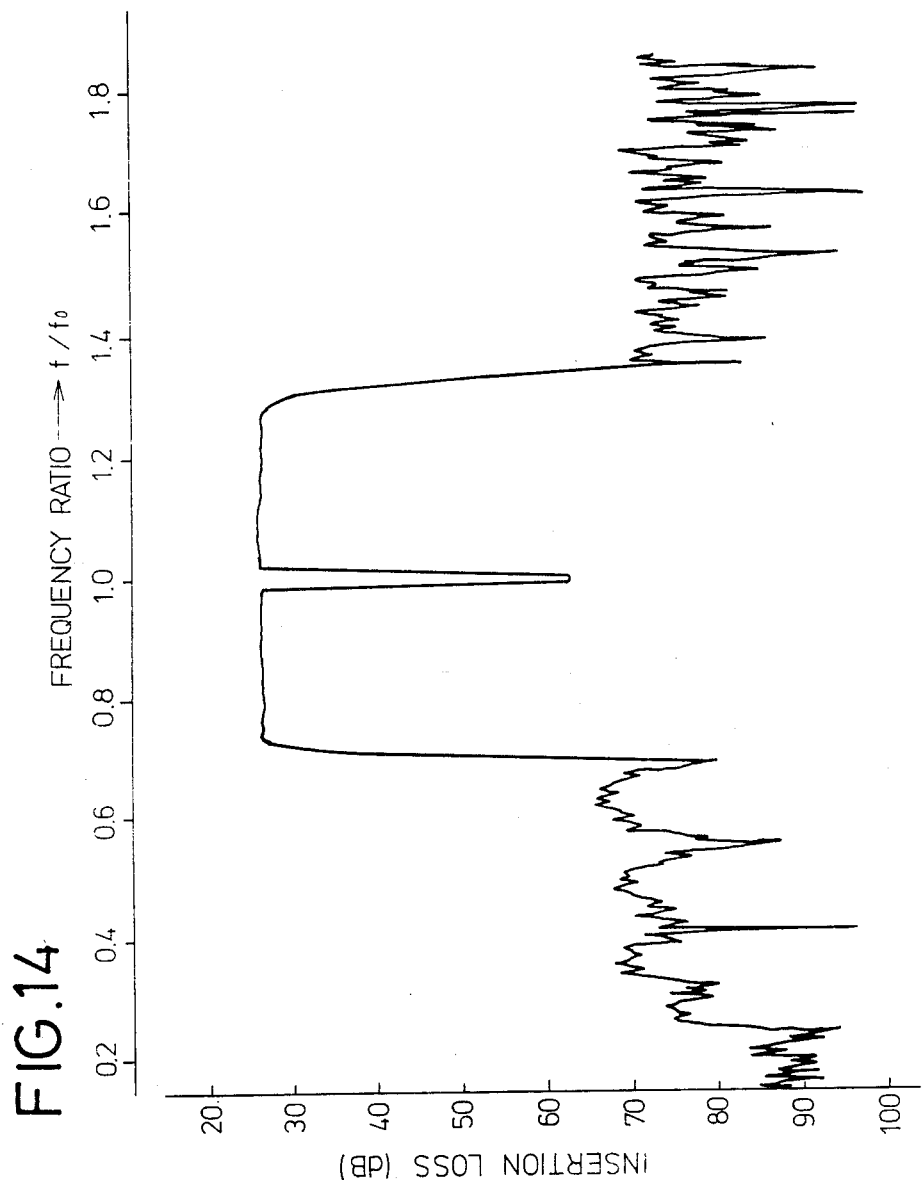
FIG. 14 is a diagram of frequency characteristics of a notch filter composed of the filter of FIG. 12 with a scattering reflector incorporated therein.

FIG. 12 shows a surface elastic wave filter 70 according to a further embodiment of the present invention. The filter 70 has an input electrode 68 including a first group of electrode fingers 72a coupled to one common electrode and a second group f electrode fingers 72b coupled to the other common electrode. The number of electrode fingers 72a is smaller than the number of electrode fingers 72b. The electrode fingers 72b are equally spaced, whereas the electrode fingers 72a are spaced at irregular intervals. Stated otherwise, the electrode fingers 72a are arranged as if some electrode fingers were dropped or removed from a complete set of equally spaced electrode fingers. The filter 70 also has an output electrode 74 comprising a first group of equally spaced electrode fingers 76a and a second group of equally spaced, as many electrode fingers 76b as the number of the electrode fingers 76a. The filter 70 of the above construction has highly improved selectivity since the ratio between the insertion loss at passed frequencies and the loss at cut-off frequencies is more than 40 dB, as shown in FIG. 13. The frequency characteristic curve shown in FIG. 13 has good knee characteristics, and the 30 dB/3 dB shape factor can be achieved within 1.1. The horizontal frequency axis in FIG. 13 is normalized. The improved selectivity of the filter 70 is accomplished since the propagation region of a surface elastic wave is narrowed by the reduced number of electrode fingers, and the intensity of the surface elastic wave in the region other than the propagation region is highly small. By locating a scattering reflector in a desired position between the input and output electrodes 68, 74 of the filter 70, therefore, the range of rejected frequencies can be greatly reduced and the amount of attenuation of the rejected frequencies can be increased inasmuch as the propagation region of a surface elastic wave of a certain frequency is narrowed (see FIG. 14).

Figure 15:
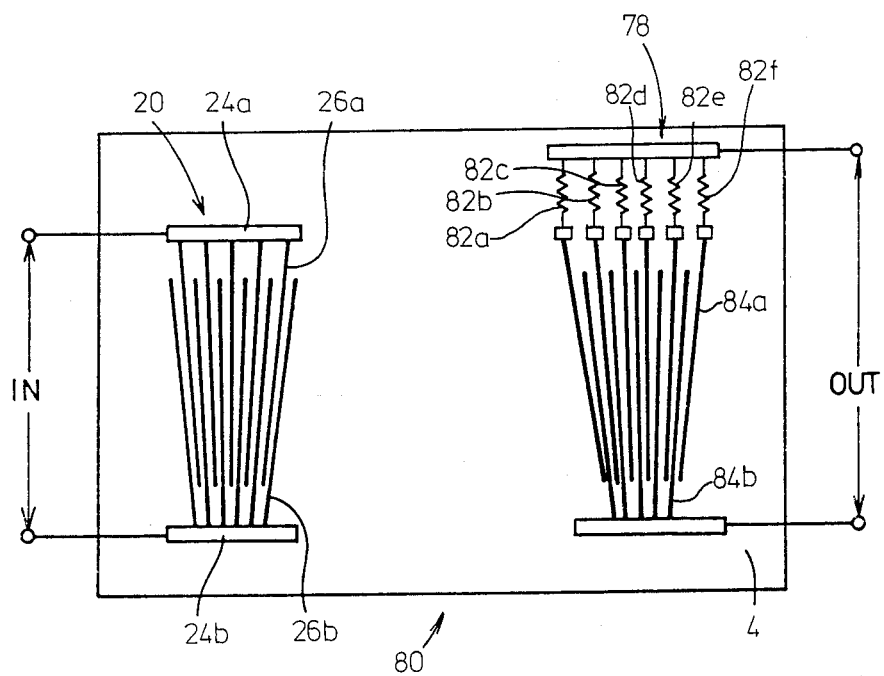
FIG. 15 is a plan view of a surface elastic wave filter according to a still further embodiment of the present invention.

FIG. 15 illustrates a surface elastic wave filter 80 including an output electrode 78 having electrode fingers to which divided voltages are applied. The filter 80 also includes an input electrode 20 which is identical to that shown in FIG. 10. The divided voltages to be applied to the electrode fingers of the output electrode 78 are produced respectively by voltage-divider resistors 82a through 82f. The selectivity of the filter 80 can be improved, as with the filter 70 shown in FIG. 12, by selecting the resistances of the resistors 82a through 82f such that they are progressively greater from the center toward outer sides of the resistor array, e.g., they meet the following inequality:

$$(82c=82d)<(82b=82e)<(82a=82f)$$

Where the filter 80 is combined with a scattering reflector as described above, a notch filter with goo knee characteristics and selectivity can be achieved.

Dropping or removal of certain electrode fingers from a complete set of electrode fingers according to the present invention, thereby providing the first group of electrode fingers 72a as shown in FIG. 12, is not realization of a function obtained by inversely Fourier-transforming frequency characteristics required of a filter, as has been the case with conventional parallel electrode fingers. More specifically, the filter shown in FIG. 2 has its desired frequency characteristics determined by adjusting the maximum and minimum spacings between the electrode fingers. Even if some of the electrode fingers of the filter of FIG. 2 were dropped or removed as shown in FIG. 12, the function of such an electrode finger dropping process and the passband would have almost no bearing on one another. In order to improve selectivity of frequency characteristics in the present invention, it is important to appropriately select the relationship between the excitation intensity distribution on the propagation path of the surface elastic wave at the time of applying a certain frequency and the reception intensity distribution on the output side. The function for effecting electrode finger removal should be selected to this end.

According to the present invention, as described above, at least one of a pair of electrodes on a surface of a piezoelectric body is constructed as electrode fingers in the form of comb teeth which are progressively spread away from each other along a direction normal to the direction in which a surface elastic wave is propagated on the surface of the piezoelectric body, and a grating or dot structure as a scattering reflector for scattering and reflecting a portion of the surface elastic wave is disposed in a desired position between the electrodes, or some of electrode fingers of a surface elastic wave filter are dropped or removed, or divided voltages are applied to electrode fingers, or a scattering reflector is added to a filter with some of its electrode fingers removed or with divided voltages applied to electrode fingers. With such an arrangement, a filter having good selectivity and desired frequency characteristics can be achieved. There can thus be provided a surface elastic wave filter capable of producing an output signal of complex frequency characteristics without the addition of an external filter circuit and of controlling frequency characteristics without requiring a complex and large arrangement.

Although certain preferred embodiments have been shown and described, it should be understood that many changes and modifications may be made therein without departing from the scope of the appended claims.

What is claimed is:

1. A surface elastic wave filter comprising:
   a piezoelectric body having a surface;
   a pair of electrodes disposed on said surface for sending and receiving a surface elastic wave between said electrodes to pick up a signal of prescribed frequency bandwidth characteristics, at least one of said electrodes comprising a plurality of splayed electrode fingers; and
   a structure disposed on said surface between said electrodes for scattering and reflecting surface elastic waves having prescribed frequencies within said bandwidth.

2. A surface elastic wave filter according to claim 1 wherein said structure comprises a grating structure.

3. A surface elastic wave filter according to claim 1, wherein said structure comprises a dot structure.

4. A surface elastic wave filter according to claim 3, wherein said dot structure comprises a plurality of dots spaced at a constant spacing and arranged at a pitch equal to a multiple of $\frac{1}{4}$ of the wavelength of the surface elastic wave.

5. A surface elastic wave filter according to any one of claims 1 through 4, wherein said structure is inclined from a direction normal to the direction in which the surface elastic wave is propagated between said electrodes.

6. A surface elastic wave filter comprising:
   a piezoelectric body having a surface;
   a pair of electrodes disposed on said surface for sending and receiving a surface elastic wave between said electrodes to pick up a signal of prescribed frequency characteristics, at least one of said electrodes comprising a plurality of splayed electrode fingers; and
   one or both of said electrodes comprising a group of irregularly spaced electrode fingers and being devoid of electrode fingers which would otherwise make a complete set of equally spaced electrode fingers if combined with said group of irregularly spaced electrode fingers.

7. A surface elastic wave filter comprising:
   a piezoelectric body having a surface;
   a pair of electrodes disposed on said surface for sending and receiving a surface elastic wave between said electrodes to pick up a signal of prescribed frequency characteristics, at least one of said electrodes comprising a plurality of electrode fingers progressively spread from each other; and
   a plurality of resistors connected in series respectively with electrode fingers of one or both of said electrodes.

8. A surface elastic wave filter according to claim 6 or 7, further including a scattering reflector comprising a grating structure and disposed on said surface on which said surface elastic wave is propagated.

9. A surface elastic wave filter according to claim 6 or 7, further including a scattering reflector comprising a dot structure and disposed on said surface on which said surface elastic wave is propagated.

10. A surface elastic wave filter according to claim 6 or 7, further including a scattering reflector comprising a grating structure and dot structure and disposed on said surface on which said surface elastic wave is propagated.

* * * * *